Figure 1:
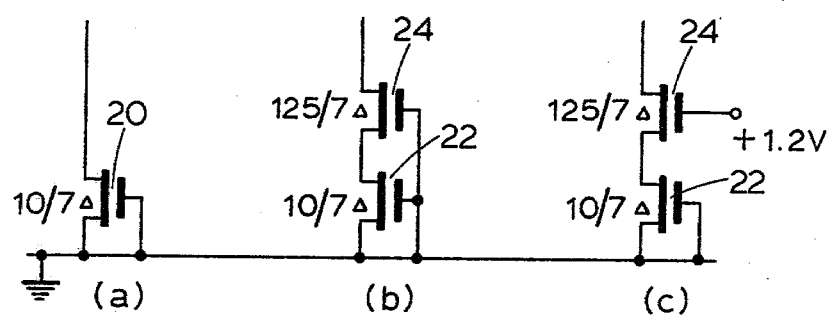

United States Patent [19]

Hilbourne

[11] 4,247,824
[45] Jan. 27, 1981

[54] LINEAR AMPLIFIER

[75] Inventor: Robert A. Hilbourne, Eastleigh, England

[73] Assignee: U.S. Philips Corporation, New York, N.Y.

[21] Appl. No.: 970,888

[22] Filed: Dec. 19, 1978

[30] Foreign Application Priority Data

Dec. 30, 1977 [GB] United Kingdom ............ 54306/77

[51] Int. Cl.³ ......................... H03F 3/16; H03F 3/45
[52] U.S. Cl. .................................. 330/253; 330/277; 330/311
[58] Field of Search ............... 330/253, 257, 258, 277, 330/297, 300, 310, 311

[56] References Cited

U.S. PATENT DOCUMENTS

| | | | |
|---|---|---|---|
| 3,715,693 | 2/1973 | Fletcher et al. ................ | 330/253 X |
| 3,913,026 | 10/1975 | Koehler ............................. | 330/277 |
| 3,947,778 | 3/1976 | Hsiao et al. ....................... | 330/253 |
| 4,069,431 | 1/1978 | Kucharewski .................... | 330/253 X |

*Primary Examiner*—James B. Mullins
*Attorney, Agent, or Firm*—William J. Streeter; Bernard Franzblau

[57] ABSTRACT

A high gain linear amplifier comprises an MOS transistor amplifier stage having a load circuit which includes two depletion mode transistors connected in cascode. A compensating circuit compensates the variation of threshold voltage ($V_T$) with back bias voltage ($V_{SB}$) of the cascode load transistors by applying a voltage to the gate electrode of one of said two transistors in the opposite sense to the $V_T$-$V_{SB}$ variation. The compensating voltage may be produced by connecting an enhancement mode transistor in cascode with a depletion mode transistor with the drain of the enhancement transistor connected to the source of the depletion transistor and to the common connection of their gates which also are connected to the gates of the load transistors.

11 Claims, 14 Drawing Figures

LINEAR AMPLIFIER

The present invention relates to linear amplifiers, particularly amplifiers made of n-channel MOS (metal oxide semiconductor) transistors fabricated as integrated circuits. Such amplifiers find application in digital systems for bringing low level signals up to digital levels, for example in comparators for analogue to digital convertors and low level pulse amplifiers.

A feature of n-channel MOS transistors is that they have a low mutual conductance, gm, for example of the order of 0.5 mA/volt for a transistor with a width of 250$\mu$ and length 6$\mu$ operating at 200 $\mu$A compared with typically 8 mA/volt for a bipolar transistor of a comparable chip area, 10000$\mu^2$, operating at the same current. The voltage gain of an amplifier is gm.$R_E$ where $R_E$ is the effective load resistance which comprises the load resistance and output resistance in parallel. In the case of an amplifier having a bipolar transistor, a gain of 100 can be obtained with an effective load resistance, $R_E$ of 12 K$\Omega$. As this value is low compared with the output resistance, the load resistance can be 12 k$\Omega$. In the case of an amplifier having an MOS transistor, in order to obtain the same voltage gain an effective load resistance of 200 K$\Omega$ would be required. However a load resistance of such a value would cause a high d.c. voltage drop across the load which would require a high supply voltage or that the MOS transistor operate at a low value of current. Accordingly in order to obtain a high gain amplifier using MOS transistors, the load resistance should have a high slope resistance but a low chord (d.c.) resistance thereby enabling the supply voltage to be lower than would be necessary with a high value load resistance of the operating current to be increased.

A known linear high gain amplifier operating at low voltages is disclosed in U.S. Pat. No. 3,678,407. Each amplifier stage of a described embodiment comprises a "P" channel enhancement mode insulated gate metal-oxide semiconductor field effect transistor (MOSFET). The load circuit for the amplifying MOSFET comprises two parallel paths which together have the effect of providing a high slope resistance and low chord resistance. In one of the paths a first transistor is provided which transistor acts as a constant current source and constitutes an auxiliary load. The other of the paths comprises one or more transistors, each having its gate and drain connected together and constituting a biasing circuit for the first transistor, and a further transistor having its gate and drain connected together and constituting a main resistive load. In operation, with low currents through the amplifying MOSFET the impedance of the auxiliary load transistor is low compared to that of the load transistor. However, as the current is increased, the pinch-off current value of the auxiliary load transistor is reached causing its impedance to increase to a larger value. Since the two load transistors are coupled in parallel, the effective dynamic impedance and amplifier gain can now approximate to that of a FET amplifier having a conventional load. In this known circuit, the supply voltage is kept low and the D.C. source-drain current of the amplifying MOSFET is higher than would be possible with a conventional load. However the overall gain of the stage is still no greater than would be obtained with a conventional load resistance.

Accordingly it is an object of the present invention to increase the gain of a linear MOS amplifier having a load resistance which has a high slope resistance and a low chord resistance.

According to the present invention there is provided a linear amplifier comprising an MOS transistor amplifying stage having a signal input and a signal output circuit, a load circuit connected in the signal output circuit, the load circuit comprising first and second MOS transistors connected in cascode and compensation means for biasing the gate electrodes of the first and second transistors in dependence on the voltage across the cascode connection so as to maintain the apparent differential resistance of the cascode connection.

The first and second transistors may comprise depletion mode n-channel MOS transistors.

The compensation means may comprise third and fourth MOS transistors connected in series, and in parallel to the cascode connected first and second transistors. The gates of the third and fourth transistors are connected together and furthermore are connected to the gates of the first and second transistors and to the connection of the drain of the fourth transistor with the source of the third transistor.

The first, second and third transistors may be depletion mode MOS transistors and the fourth transistor may be an enhancement mode MOS transistor.

In order to facilitate the fabrication of the linear amplifier as an integrated circuit, the amplifying stage may comprise a long-tail-pair amplifying circuit having first and second legs connected to a common current supply circuit, the first and second legs each having an amplifying element with a compensated cascode load in its output circuit, and wherein an input signal is applied differentially to the inputs of the amplifying elements.

The long-tail-pair amplifying circuit may include a common mode feedback system. Such a feedback system enables the outputs to be correctly biassed even though the tail current and load characteristics cannot be defined accurately.

The output circuits may be connected to a circuit for combining said outputs to form a single low voltage output which is suitable for use with digital circuitry.

Figure 2:
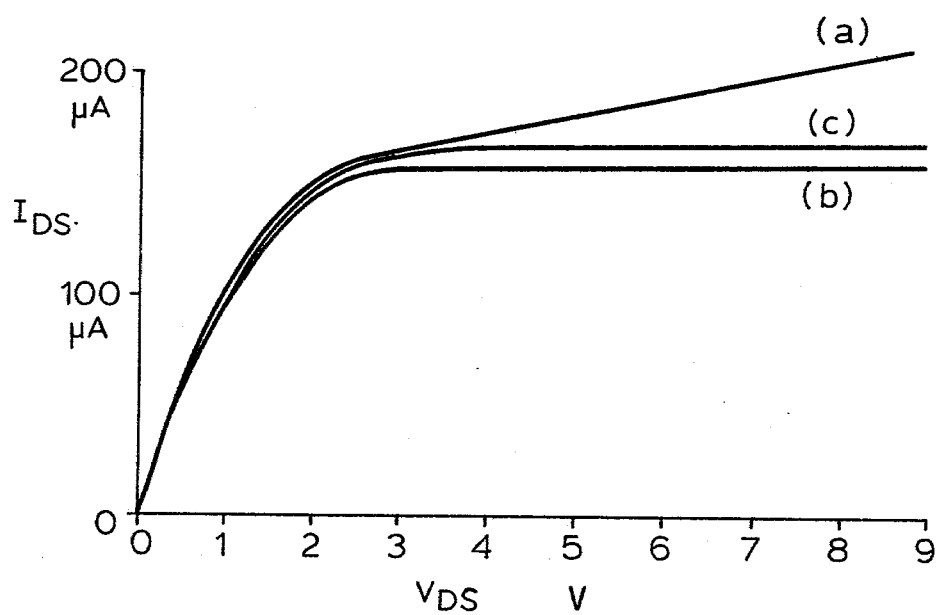
Figure 3:
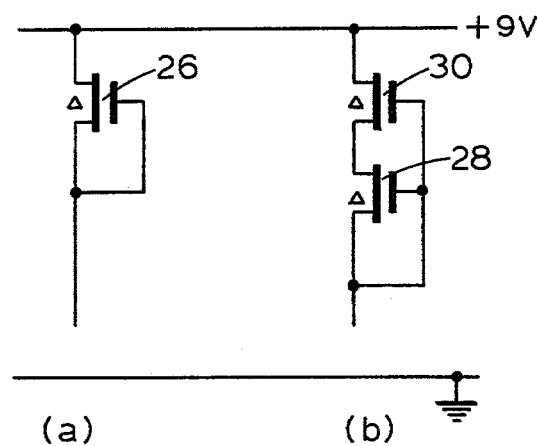
Figure 4:
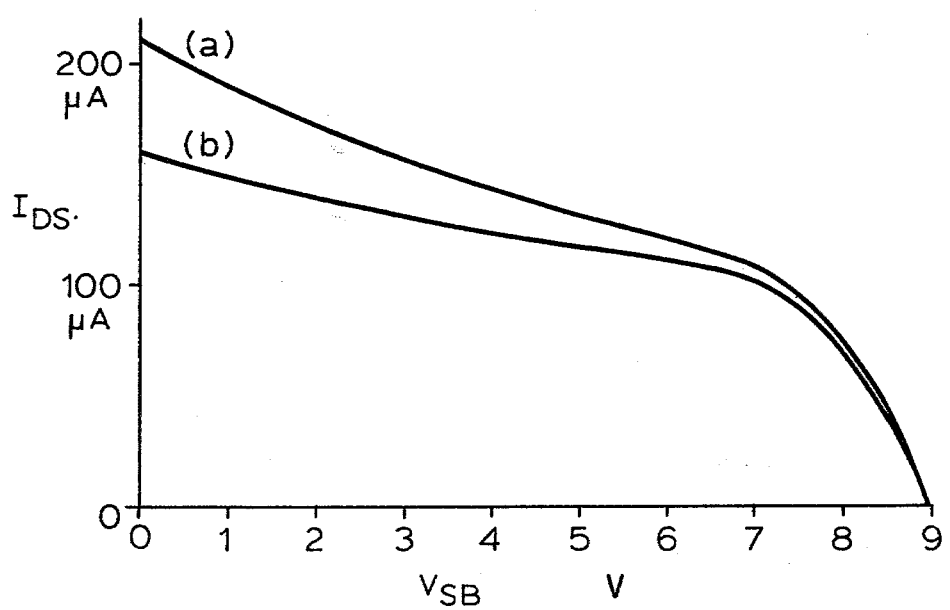
Figure 5:
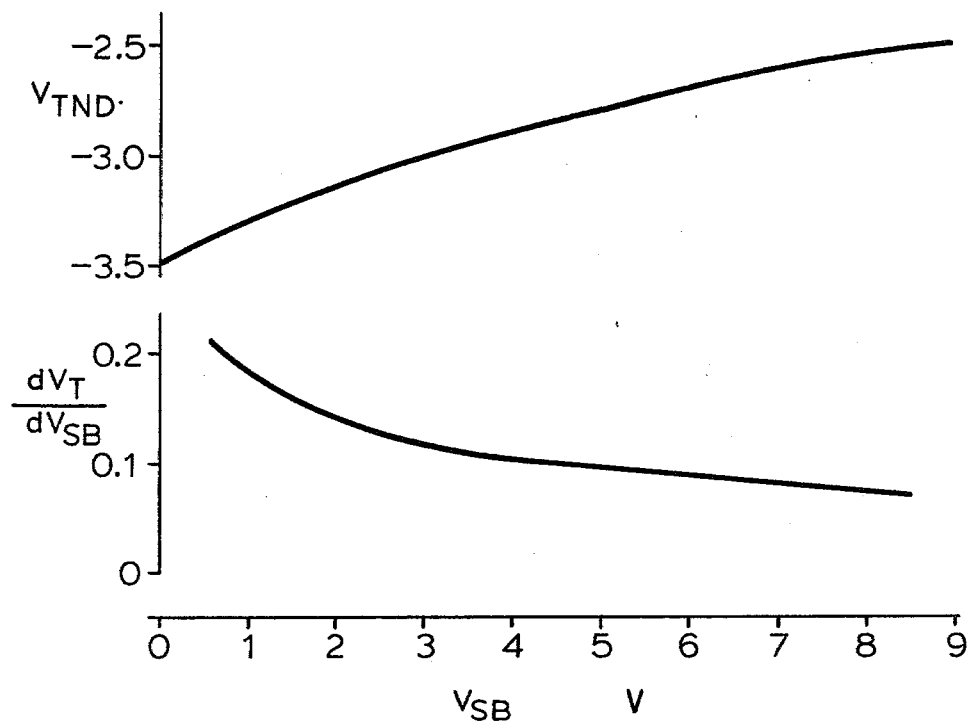
Figure 6:
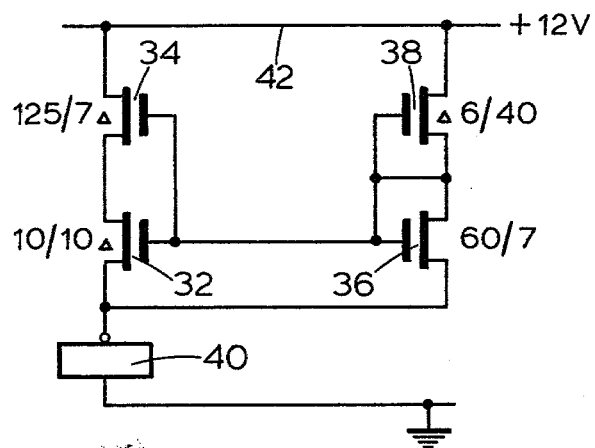
Figure 7:
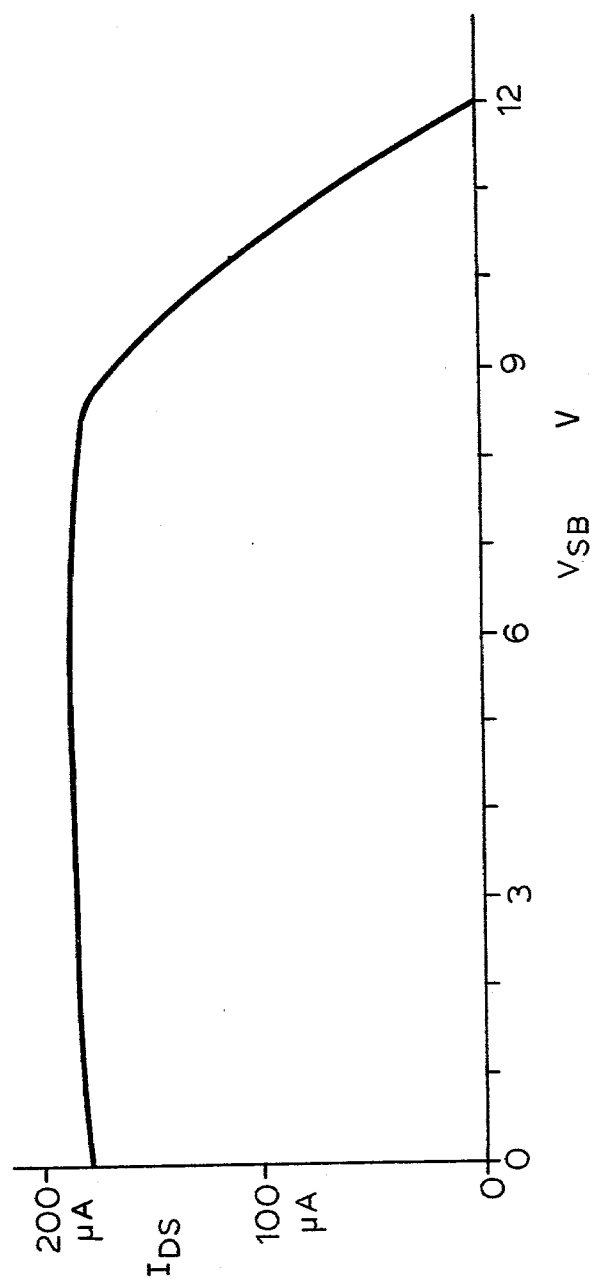
Figure 8:
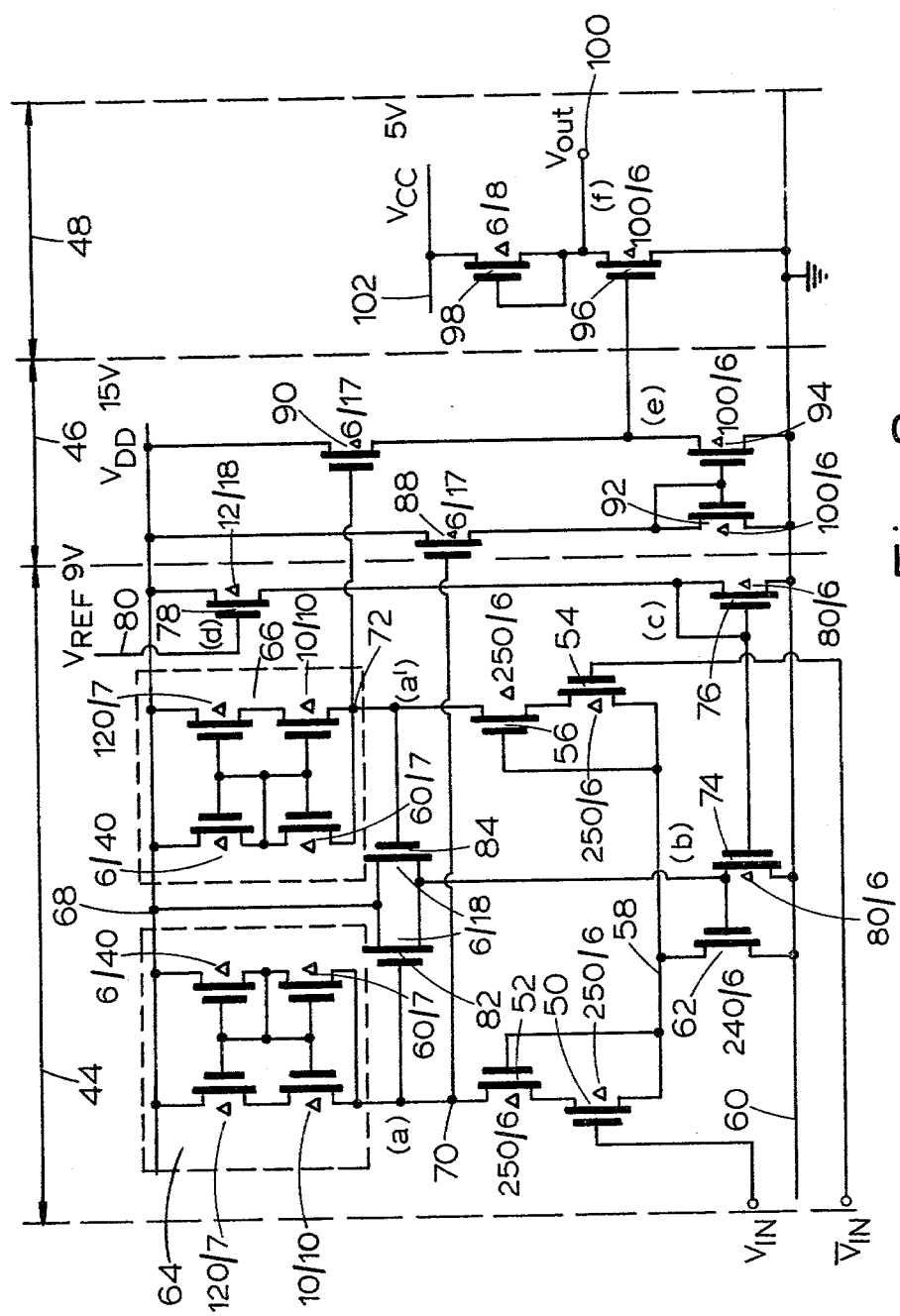
Figure 9:
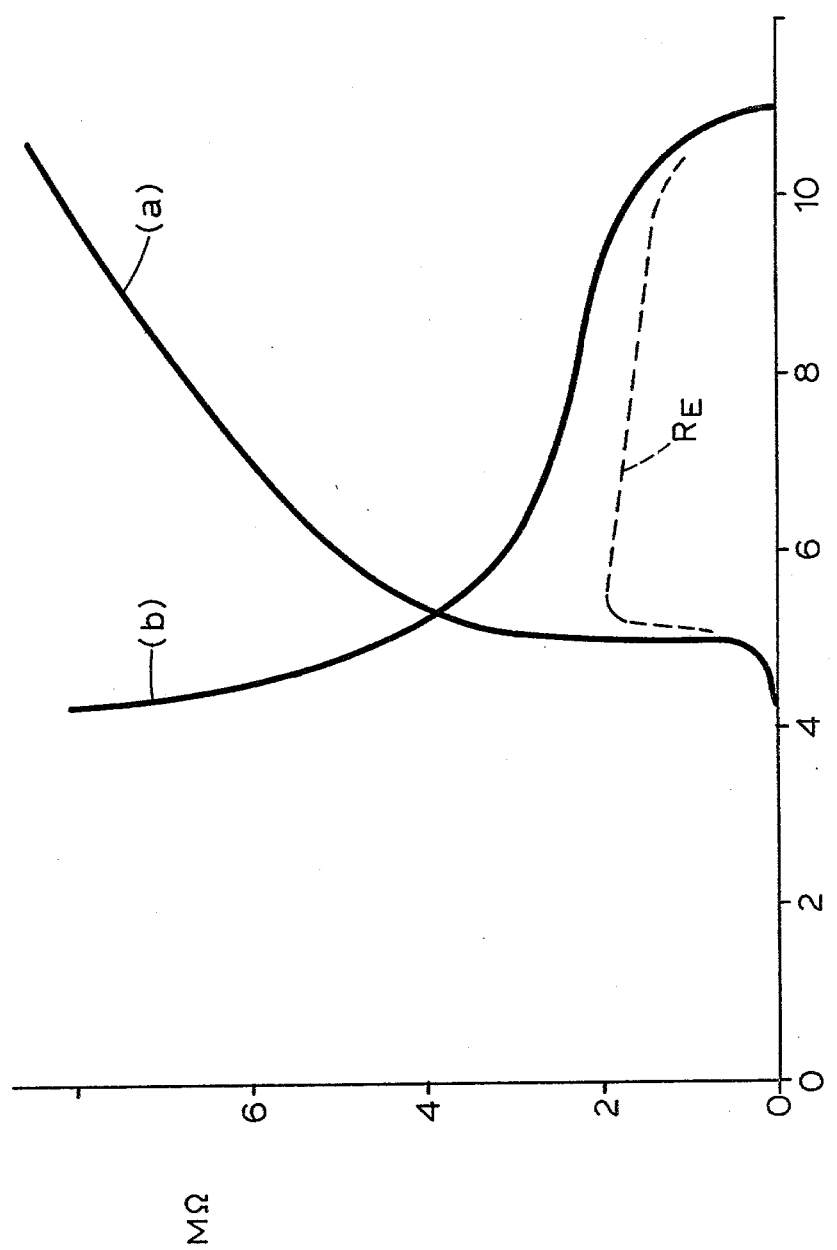
Figure 10:
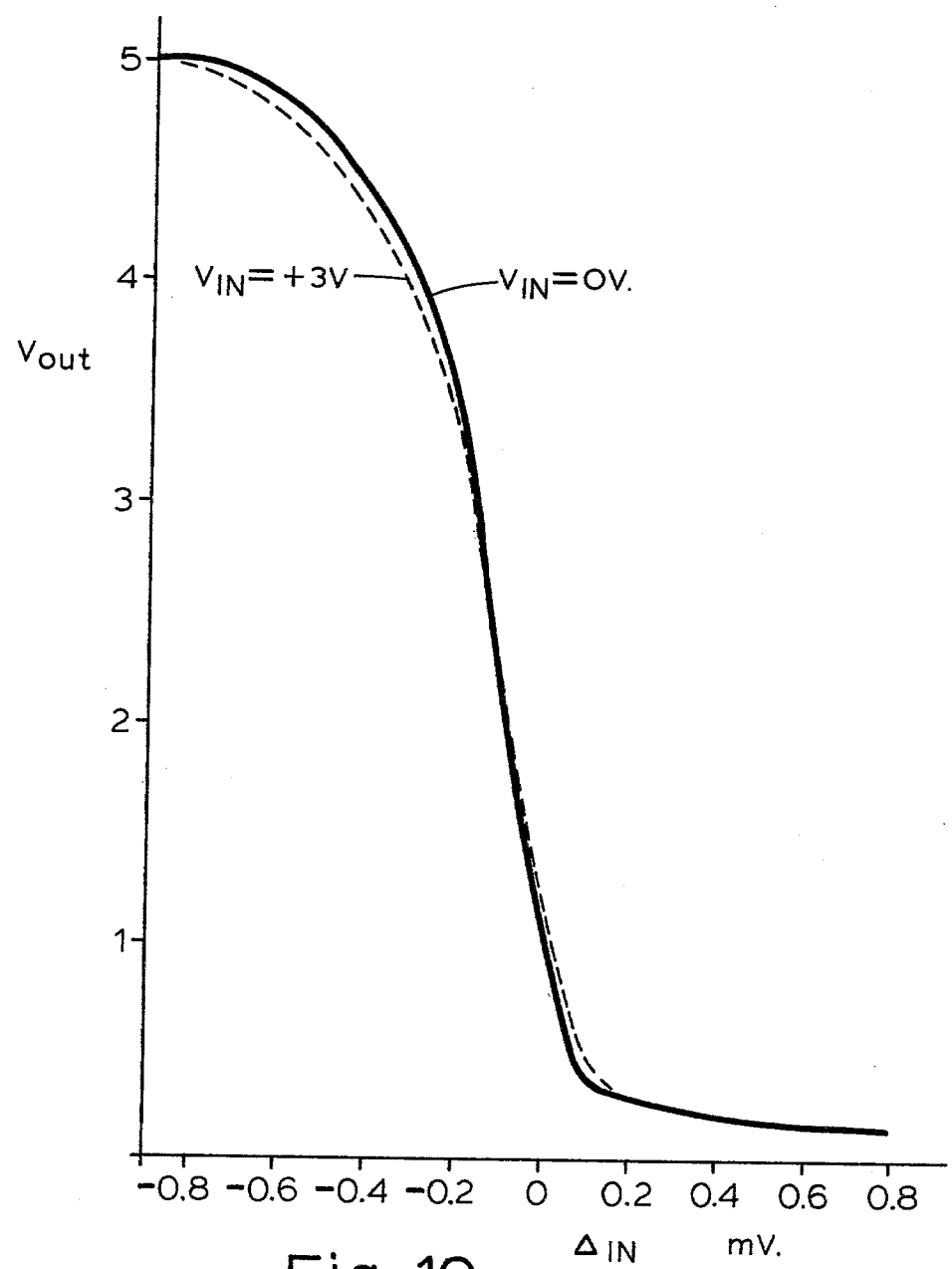
Figure 11:
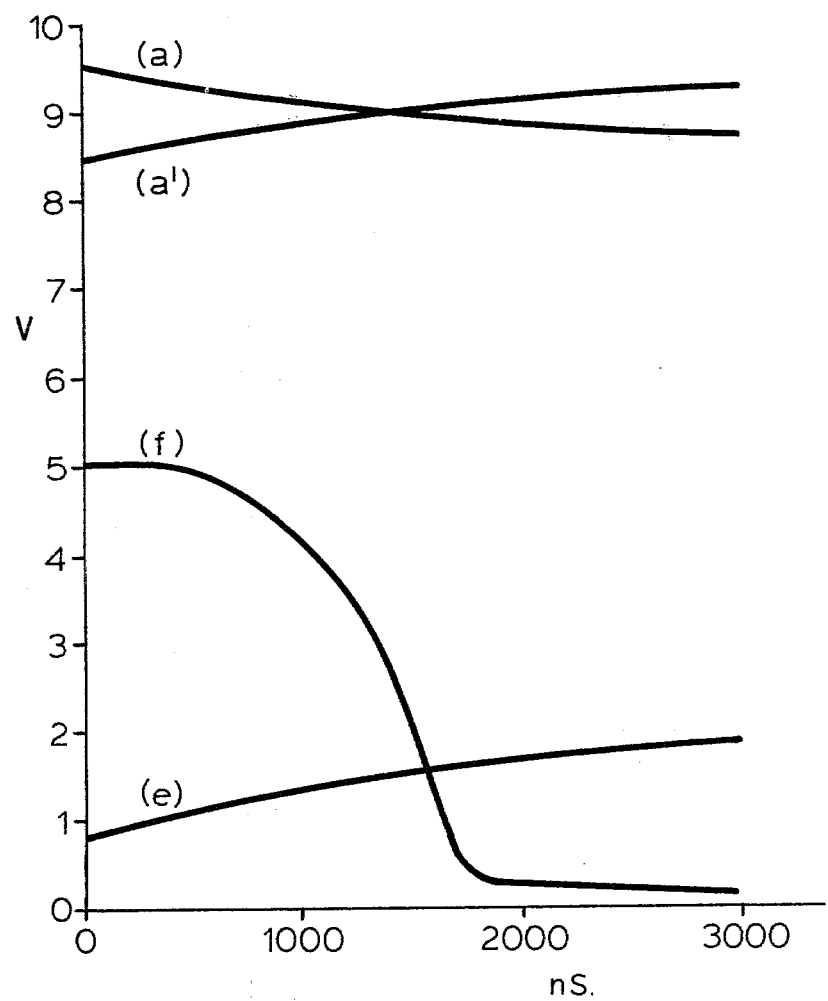

The present invention will now be explained and described, by way of example, with reference to the accompanying drawings, wherein:

FIGS. 1a, b and c show schematically three known depletion mode n-channel MOS-transistor circuits, FIG. 2 is a graph showing the drain-source current ($I_{DS}$) plotted against the drain-source voltage ($V_{DS}$) of the three circuits shown in FIG. 1, FIGS. 3(a) and 3(b) show schematically two known load circuits, FIG. 4 is a graph showing the variation in the drain-source current ($I_{DS}$) with the source-substrate voltage ($V_{SB}$) for the load circuits of FIGS. 3(a) and (3b), FIG. 5 shows in the upper graph the variation of $V_{TND}$ with $V_{SB}$ and in the lower graph the variation of $dV_T/dV_{SB}$ with $V_{SB}$ for the cascode load of FIG. 3(b), FIG. 6 is a schematic circuit diagram of a compensated cascode load, FIG. 7 is a graph of $I_{DS}$-$V_{SB}$ for the load of FIG. 6, FIG. 8 is a schematic circuit diagram of a long-tail-pair amplifier having a compensated cascode load in each leg of the amplifier circuit, and FIGS. 9, 10 and 11 are graphs showing various characteristics of the amplifier of FIG. 8.

Referring initially to FIGS. 1 and 2 of the accompanying drawings. FIG. 1(a) shows a depletion mode n-channel MOS transistor 20 with its source and gate connected to ground. The width to length (W/L) ratio of the gate of this transistor is $10\mu/7\mu$, normally expressed as 10/7. The $V_{DS}$-$I_{DS}$ curve (a) of FIG. 2 relates to the transistor 20 which has a channel length $L'$ of $5\mu$ and a threshold voltage, $V_{TND}$, $-3.5$ volts. Above saturation, the substantially straight portion of curve (a) has a slope resistance (output resistance) of the order of 128 k$\Omega$. The change in slope resistance is caused by a reduction in the effective channel length due to the increase in the length of the depletion region around the drain. However the slope resistance is inversely proportional to $I_{DS}$, and increases as the channel length $L'$ is increased. In FIG. 1(a) the chord resistance at $I_{DS}$ of 200 $\mu$A is 37.5 k$\Omega$.

The circuit of FIG. 1(b) shows a pair of depletion mode n-channel MOS transistors 22, 24 connected in a cascode arrangement which gives a significantly increased output resistance (3.2 m$\Omega$) compared with the circuit of FIG. 1(a). The gates of the MOS transistors 22, 24 are connected to ground. In this circuit, the transistor 22 determines the current which is used to bias the source of the transistor 24, which has a much larger W/L (125/7) than that of the transistor 22 (10/7), to give the required current. In the high output resistance region of the illustrated circuit, the drain voltage of the transistor 22 equals 2.3 V which is the same as the source voltage of the transistor 24. Also $$R_{out} = R_{out24} (1 + gm_{24} \cdot R_{out22})$$

where $R_{out}$ is the output resistance of the circuit, $R_{out22}$ and $R_{out24}$ are the output resistances of the transistors 22 and 24, respectively, and $gm_{24}$ is the mutual conductance of the transistor 24.

The circuit of FIG. 1(c) shows the transistors 22 and 24 in which the gate of the transistor 22 is connected to ground and the gate of the transistor 24 is connected to a voltage source of $+1.2$ volts. The effect of biassing the transistor 24 separately, as opposed to connecting it to ground (FIG. 1(b)), is to increase the voltage on the drain of the transistor 22 to 3.4 volts and the resultant increase in $R_{out22}$ increases the effective output resistance, $R_{out}$, to between 6 and 9 M$\omega$(curve (c) of FIG. 2).

FIGS. 3 and 4 relate to the use of depletion n-channel MOS transistors as loads. In the case of FIG. 3(a), the load comprises a single depletion n-channel MOS transistor 26 having its gate connected to its source. The W/L ratio of the transistor 26 is 10/7 which is the same as that of the transistor 20 in FIG. 1(a). FIG. 4 is a graph of the drain-source current $I_{DS}$ plotted against the source-substrate voltage $V_{SB}$. The curve (a) is the characteristic obtained with the load of FIG. 3(a). The slope resistance of the saturated region of the curve (a) is 78 k$\omega$ which is much lower than that of the curve (a) in FIG. 2.

The load shown in FIG. 3(b) comprises cascode connected depletion-mode n-channel MOS transistors 28, 30 which have the same W/L ratios as the transistors 22, 24 (FIG. 1b), respectively. The characteristic curve of this load is shown in curve (b) of FIG. 4 and the slope resistance of 150 k$\omega$ is significantly below that of the curve (b) in FIG. 2.

The reason for the slope resistance of each of the load transistor arrangements being lower than those of FIGS. 1(a) and 1(b) is the effect of the variation of the threshold voltage $V_T$ with back bias, that is $V_{SB}$. This variation is shown in the upper curve of FIG. 5, the lower curve of which shows $dV_T/dV_{SB}$. As $V_{SB}$ increases, the threshold voltage $V_{TND}$ of a depletion mode n-MOS transistor becomes more positive, that is reduces in magnitude and the effective gate voltage reduces. In curve (b) of FIG. 4, the slope resistance is almost entirely due to this effect. Thus $R_{slope} = 1/gm_{(2-8)} \cdot dV_T/dV_{SB}$. As is apparent from the lower curve of FIG. 5, the most rapid change of $V_T$ occurs at low values of $V_{SB}$ and as a result the slope resistance is lower in that region.

In order to overcome this back bias effect on $V_T$ with a cascode connected load, it is necessary to apply a voltage to the gates of the load transistors, which voltage varies in the opposite manner to the variation in $V_T$. A circuit for achieving this compensation is shown in FIG. 6.

FIG. 6 shows a compensated cascode load circuit comprising a cascode load formed by depletion-mode n-channel MOS transistors 32, 34 having W/L ratios of 10/10 and 125/7, respectively, and a compensation circuit comprising enhancement-mode n-channel MOS transistor 36 with a W/L ratio of 60/7 and depletion-mode n-channel MOS transistor 38 with a W/L ratio of 6/40. The transistor 36, 38 are connected in a cascode manner in that the drain of the transistor 36 is connected to the source of the transistor 38 and their gates are connected together. However the gates of transistors 36 and 38 are connected to the source of transistor 38 and the drain of transistor 36. The gates of all four transistors are connected together and the source of the transistor 36 is connected to the source of the transistor 32 which in turn is connected to an amplifying transistor 40. The drains of the transistor 34, 38 are connected to a bias voltage supply rail 42 which in the illustrated example is at $+12$ volts.

In describing the operation of the load circuit of FIG. 6, reference will be made to the $I_{DS}$-$V_{SB}$ curve of FIG. 7. If the compensation circuit, transistors 36, 38, was not provided then the graph of FIG. 7 would resemble the curve (b) of FIG. 4 and as a result the output resistance of 100 k$\omega$ to 200 k$\omega$ would be insufficient to provide the amplifying transistor 40 with a sufficiently high gain in excess of x 50. In order to overcome the back bias effect mentioned in connection with FIGS. 3 to 5, a low current is fed by way of the transistor 38 to the transistor 36. As shown in FIG. 6, the transistor 36 has a large W/L ratio of 60/7 so that the voltage drop across it, for example 1.3 volts, is only a little larger than its threshold voltage $V_{TN}$ which for example equals 1.0 volt. The voltage of 1.3. volts across the transistor 36 is applied to the gates of the transistors 32, 34. As the source-substrate voltage, $V_{SB}$, is increased, the $V_{TN}$ of the transistor 36 and thereby the voltage drop across it increases. This effect ideally cancels out the effect of the variation of the $V_T$ of the transistor 32 with source-substrate voltage so that the value of the load resistance remains high, for example 1 M$\omega$ or greater, although the chord resistance is kept low. In FIG. 7, which is a calculated graph, over compensation has occured at low values of $V_{SB}$ so that the curve has a negative resistance region. However the middle region has a resistance of at least 1 M$\omega$.

If the compensated load is combined with a suitable amplifying transistor a linear amplifier having voltage gains of the order of several hundred times will be achieved with a low bias supply voltage of 12 to 15 volts.

As the compensated load comprises MOS transistors it can readily be fabricated, together with the remainder of the amplifier, as an integrated circuit. The amplifying transistors can comprise cascode connected transistor pairs which themselves form the current amplifying stages of a long tail pair circuit. Such a circuit is shown in FIG. 8.

The circuit of FIG. 8 can be conveniently considered as comprising three sections—an amplifying section 44, a section 46 for combining the balanced outputs of the section 44 and feeding them to a low voltage output and a low voltage output section 48, the output of which can be used to drive directly a logic stage.

The section 44 essentially comprises a long tail pair amplifier with compensated cascode loads and a common mode feedback system to adjust the tail current. The amplifier comprises pairs of cascode connected depletion mode, n-channel MOS transistors 50, 52 and 54, 56. The gate of the transistor 50 is connected to an input terminal $V_{IN}$ and the gate of the transistor 54 is connected to another input terminal $\overline{V}_{IN}$. The gates of the transistors 52, 56 are connected to a common tail point 58 which is connected to a bias voltage rail 60 at ground potential by way of an enhancement mode n-MOS transistor 62. Compensated cascode loads 64, 66 are connected to the drain circuits of the transistors 52, 56, respectively, and to a bias voltage supply rail 68 at a $V_{DD}$ of +15 volts. Each of the loads 64, 66 is essentially the same as that described with reference to FIG. 6 and in the interests of brevity they will not be described again. The balanced outputs of the amplifier are taken from the points 70, 72 in the drain circuits of the transistors 52, 56, respectively.

Because of difficulty in defining the tail current and the load characteristics with sufficient accuracy to ensure that the outputs are correctly biased, the common mode feedback system is provided. This feedback system includes a current mirror circuit comprising enhancement mode n-channel MOS transistors 74, 76, the drain and gate of the transistor 76 being joined together. An enhancement mode n-channel MOS transistor 78 has its source connected to the drain of the transistor 76, its drain connected to the rail 68 and its gate connected to a reference voltage supply line 80 which is connected in use to a supply of 9 volts. The reference voltage is used to adjust the amplifier centre point. Two other enhancement mode n-channel MOS transistors 82, 84 are provided. The gates of the transistors 82, 84 are connected to the drains of the transistors 52, 56, respectively, the drains of the transistors 82, 84 are connected together and to the rail 68 and their sources are connected together and to the connection between the drain of the transistor 74 and the gate of the transistor 62. By making the W/L ratio of the transistors 82 and 84 half that of transistor 78 the voltage drop (d)—(c) is approximately equal to (a)—(b). The W/L ratio of the transistor 62 is chosen so that the voltage at (b) is substantially equal to that at (c). By means of the described feedback system, large variations in load characteristics can be compensated by small variations in the voltage at (b) (and hence at (a)) because of the large loop gain of the transistors 82, 62 and the load network. Furthermore, because of the balanced biassing circuit, variations in the $V_{TO}$ of the enhancement mode transistors 62, 74, 76, 78, 82 and 84 have little effect on the centre point voltage of the amplifier.

The section 46 comprises enhancement mode n-channel MOS transistors 88, 90, 92 and 94. The gates of the transistors 88, 90, which comprise voltage dropping transistors, are connected respectively to the amplifier output points 70, 72 and their drains are connected to the rail 68 and their sources are connected respectively to the drains of the transistors 92, 94. The transistors 92, 94 constitute another current mirror circuit with the drain and gate of the transistor 92 connected together. A low voltage single ended output is derived from the drain of the transistor 94.

The low voltage output section 48 comprises an enhancement mode n-channel transistor 96 having its gate connected to the drain of the transistor 94 and its drain connected to an output terminal 100. The drain is further connected to a voltage supply rail 102 at a $V_{CC}$ of 5 volts by way of a depletion mode n-channel MOS transistor 98 having its gate connected to its source so as to constitute a resistance.

Considering the basic cascode arrangement of the transistors 50, 52 and 54, 56, if for example the tail point 58 is at 2.5 volts, that is ($V_{TND}$ − 1 V) where $V_{TND}$ is the threshold voltage for an n-channel depletion mode transistor, the source of the transistor 52 or 56 is a further 2.5 volts up on this and as a result the minimum operating voltage is of the order of 5 volts (2 $V_{TND}$ − 2 V). If the balanced inputs are at a voltage greater than ground, for example 1 volt, the tail point 58 and hence the minimum operating voltage are increased accordingly. As it has been found that the compensated cascode load will not operate above about $V_{DD}$ − 4 volts, it is necessary to have a supply voltage of 15 v ± 10%.

The variation of the output resistance, $R_{out}$, of the cascode transistor 52 (FIG. 8) as a function of the voltage at the point 70 is shown in FIG. 9 (a). The curve 9 (b) shows the resistance, $R_{load}$, of the compensated cascode load 64 as a function of the voltage at the point 70 when $V_{DD}$ equals +15 volts. The effective resistance, $R_E$, at the point 70 is shown in FIG. 9 as a broken line curve and the shape of the curve is determined by considering $R_{LOAD}$ and $R_{OUT}$ in parallel.

Further, as the transistors 50 and 54 are depletion mode transistors, the illustrated circuit is able to work with input levels of between 0 and +3 volts. FIG. 10 shows the transfer characteristics of the amplifier of FIG. 8 for input voltage levels, $V_{IN}$, of 0V and +3 V. As shown a 3 volt change of input level changes the effective change of input voltage $\Delta V_{INPUT}$ for 1.6 volts output by about 0.01 mV. The full logic swing (0.8 V−2.4 V) at the output terminal 100 requires an input change of less than 0.2 mV.

The performance of the amplifier of FIG. 8 is tabulated below

| $V_{DD}$ = +15V, $V_{TN}$ = +1.0V, $V_{TND}$ = −3.5V | | | | | |
|---|---|---|---|---|---|
| $V_{IN}$ | 0 | 1 | 2 | 3 | |
| Vout at (e) for $V_{IN}$ = 0 | 1.554 | 1.552 | 1.549 | 1.547 | V |
| V at (a) + (a') for $V_{IN}$ = 0 | 8.869 | 8.833 | 8.800 | 8.770 | V |
| V at (a) + (a') limit of linear operation | 6.9–10.6 | 6.9–10.6 | 7.0–10.5 | 7.8–9.7 | V |
| $I_{LOAD}$ | 184.49 | 184.50 | 184.52 | 184.54 | μA |
| Amplifier gain to (a) | 1039 | 1016 | 980 | 921 | |
| Amplifier gain to (e) | 697 | 682 | 658 | 618 | |

Thus the long-tail-pair amplifier has a gain of the order of 1000 times and the input to output gain is of the order of 660 times. When operated with an input voltage level of 0, the upper voltage excursion limit is 10.6 V (i.e. 4.4 V below the supply voltage). The amplifier centre point voltage is set at 8.9 V and hence the lower voltage excursion is only 6.9 V. The centre point voltage is set high so that as the input voltage level is increased the lower excursion limit does not prevent the circuit from operating. Thus with an input voltage level of +3 V the lower excursion limit is 7.8 V but this is still 1 volt below the centre point voltage. The transient response of this amplifier for a substantially instantaneous input voltage swing between $V_{IN}$ and $\overline{V_{IN}}$ (FIG. 8) of $-1$ mV to $+1$ mV at time $=t0$ is shown in FIG. 11. The curves referenced (a), (a'), (e) and (f) relate to the voltage changes at the correspondingly marked points in FIG. 8. The response time of the amplifier is 2.1 $\mu$S which is equivalent to a $-3$ dB frequency response of about 75 KHz.

For the sake of completeness the amplifier circuit of FIG. 8 may be modified by replacing the compensated cascode loads 64, 66 by cascoce loads of the type shown in FIG. 3 (b). The modified amplifier operating at a $V_{DD}$ of 12.0 volts has a long tail amplifier gain of the order of x 80 and an overall gain of the order of 50.

Reference herein to an MOS transistor is of course intended to be interpreted in such a broad sense as to include devices where the gate electrode is of a material other than a metal, for example poly-crystalline silicon, and where the gate insulating layer is of a composition other than wholly of silicon oxide.

What we claim is:

1. A linear amplifier comprising an MOS transistor amplifying stage having a signal input and a signal output circuit, a load circuit connected in the signal output circuit, comprising first and second MOS transistors connected in cascode, and compensation means for biasing the gate electrodes of the first and second transistors in response to the voltage across the cascode connection in a sense so as to maintain the apparent differential resistance of the cascode connection.

2. An amplifier as claimed in claim 1, wherein the first and second MOS transistors are depletion mode, n-channel transistors.

3. An amplifier as claimed in claim 2, wherein the compensation means comprises an enhancement mode MOS transistor and a depletion mode MOS transistor with the gates thereof connected together and coupled to the gates of the first and second transistors, and means connecting the drain of the enhancement transistor to the source of the depletion transistor and to its own gate.

4. A linear amplifier comprising, a transistor amplifying stage including at least one MOS transistor and having a signal input and a signal output, a bias voltage supply terminal, a load circuit coupled between said signal output and said supply terminal, said load circuit including first and second depletion mode MOS transistors of the same conductivity type with one end of the source-drain path of the first MOS transistor coupled to said signal output and the source-drain path of the second MOS transistor coupled to the other end of the source-drain path of the first transistor, and a compensating circuit coupled to gate electrodes of the first and second transistors, said compensating circuit including means for supplying a voltage to the gate electrode of the first transistor so as to counter the normal decrease in threshold voltage of said first transistor for an increase in its source-to-substrate voltage thereby maintaining the resistance value of the load circuit.

5. A linear amplifier as claimed in claim 4 wherein said compensating circuit comprises an enhancement mode MOS transistor and a depletion mode MOS transistor of the same conductivity type having their source-drain paths connected in series, one end of the source-drain path of said enhancement transistor being connected to said signal output, and means connecting the gates of said transistors together, to said gates of said first and second transistors and to a drain-source connection between said enhancement and depletion transistors.

6. A linear amplifier as claimed in claim 5 wherein said enhancement transistor has a large W/L ratio and said depletion transistor has a small W/L ratio.

7. A linear amplifier as claimed in claims 4, 5 or 6 wherein all said transistors are of the same conductivity type.

8. A linear amplifier comprising, a transistor amplifying stage including at least one MOS transistor and having a signal input and a signal output, a bias voltage supply terminal, a load circuit coupled between said signal output and said supply terminal, said load circuit including a first depletion mode MOS transistor having a source-drain path coupled between said signal output and said bias voltage supply terminal, an enhancement mode MOS transistor having one end of its source-drain path coupled to said signal output and a second depletion mode MOS transistor having one end of its source-drain path coupled to the other end of the source-drain path of said enhancement transistor and the other end of its source-drain path coupled to said supply terminal, and means coupling the gates of said first and second depletion mode transistors and said enhancement mode transistor together and to a junction of the source-drain paths of said enhancement mode and said second depletion mode transistors, and wherein the transistors of said load circuit are of the same conductivity type.

9. A linear amplifier comprising an MOS transistor amplifying stage that includes at least first and second MOS transistors connected in a long-tail pair circuit configuration having first and second legs connected to a common current supply circuit, a bias voltage supply terminal, the first leg including the first MOS transistor which has a signal output circuit coupled to said supply terminal via a first load circuit and the second leg including the second MOS transistor which has a signal output circuit coupled to said supply terminal via a second load circuit, first and second signal input terminals coupled to input electrodes of said first and second MOS transistors, respectively, each of said load circuits including third and fourth depletion mode MOS transistors of the same conductivity type connected in cascode between said supply terminal and the associated signal output circuit of the respective first or second MOS transistor of the long-tail pair circuit, and a compensating circuit coupled to gate electrodes of the third and fourth transistors, said compensating circuit including means for supplying a voltage to the gate electrode of the third transistor so as to counter the normal decrease in threshold voltage of said third transistor for an increase in its source-to-substrate voltage thereby maintaining the resistance value of the load circuit.

10. An amplifier as claimed in claim 9, wherein the long-tail-pair circuit includes a common mode feedback system.

11. An amplifier as claimed in claim 9 further comprising means connecting wherein the signal output circuits of the first and second MOS transistors to a circuit for combining their outputs to form a single low voltage output.

* * * * *